US007663121B2

(12) United States Patent
Nowak et al.

(10) Patent No.: US 7,663,121 B2
(45) Date of Patent: Feb. 16, 2010

(54) HIGH EFFICIENCY UV CURING SYSTEM

(75) Inventors: Thomas Nowak, Sunnyvale, CA (US);
Juan Carlos Rocha-Alvarez, Cupertino, CA (US); Andrzej Kaszuba, San Jose, CA (US); Scott A. Hendrickson, Brentwood, CA (US); Dustin W. Ho, Fremont, CA (US); Sanjeev Baluja, San Francisco, CA (US); Tom Cho, Palo Alto, CA (US); Josephine Chang, Sunnyvale, CA (US); Hichem M'Saad, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 129 days.

(21) Appl. No.: 11/424,368

(22) Filed: Jun. 15, 2006

(65) Prior Publication Data

US 2006/0249078 A1 Nov. 9, 2006

Related U.S. Application Data

(63) Continuation of application No. 11/124,908, filed on May 9, 2005, now abandoned.

(51) Int. Cl.
*G01N 23/00* (2006.01)
(52) U.S. Cl. .............................. 250/455.11; 250/504 R; 250/453.11
(58) Field of Classification Search ................................. 250/453.11–455.11, 504 R
See application file for complete search history.

(56) References Cited

U.S. PATENT DOCUMENTS 3,983,039 A 9/1976 Eastland 4,135,098 A 1/1979 Troue (Continued)

FOREIGN PATENT DOCUMENTS

DE 10241330 9/2003

(Continued)

OTHER PUBLICATIONS

Vig. John., Handbook of Semiconductor Wafer Cleaning Technology, Noyes Publications, 1993. Chapter 6: 233-273.

(Continued)

*Primary Examiner*—Nikita Wells
*Assistant Examiner*—Andrew Smyth
(74) *Attorney, Agent, or Firm*—Patterson & Sheridan

(57) ABSTRACT

An ultraviolet (UV) cure chamber enables curing a dielectric material disposed on a substrate and in situ cleaning thereof. A tandem process chamber provides two separate and adjacent process regions defined by a body covered with a lid having windows aligned respectively above each process region. One or more UV bulbs per process region that are covered by housings coupled to the lid emit UV light directed through the windows onto substrates located within the process regions. The UV bulbs can be an array of light emitting diodes or bulbs utilizing a source such as microwave or radio frequency. The UV light can be pulsed during a cure process. Using oxygen radical/ozone generated remotely and/or in-situ accomplishes cleaning of the chamber. Use of lamp arrays, relative motion of the substrate and lamp head, and real-time modification of lamp reflector shape and/or position can enhance uniformity of substrate illumination.

12 Claims, 7 Drawing Sheets

U.S. PATENT DOCUMENTS

| | | | |
|---|---|---|---|
| 4,411,931 A | 10/1983 | Duong | |
| 4,849,640 A | 7/1989 | Kruishoop | |
| 4,911,103 A | 3/1990 | Davis et al. | |
| 5,136,170 A * | 8/1992 | Gellert | 250/492.1 |
| 5,228,206 A | 7/1993 | Grant et al. | |
| 5,422,488 A | 6/1995 | Baier et al. | |
| 5,440,137 A | 8/1995 | Sowers | |
| 5,705,232 A | 1/1998 | Hwang et al. | |
| 5,722,761 A | 3/1998 | Knight | |
| 5,812,403 A | 9/1998 | Fong et al. | |
| 5,885,751 A | 3/1999 | Weidman et al. | |
| 5,909,994 A | 6/1999 | Blum et al. | |
| 5,973,331 A | 10/1999 | Stevens et al. | |
| 6,013,330 A | 1/2000 | Lutz | |
| 6,054,379 A | 4/2000 | Yau et al. | |
| 6,098,637 A | 8/2000 | Parke | |
| 6,178,973 B1 | 1/2001 | Franca et al. | |
| 6,201,219 B1 | 3/2001 | Sandhu et al. | |
| 6,224,934 B1 | 5/2001 | Hasei et al. | |
| 6,225,745 B1 | 5/2001 | Srivastava | |
| 6,238,844 B1 | 5/2001 | Joubert et al. | |
| 6,259,072 B1 | 7/2001 | Kinnard et al. | |
| 6,264,802 B1 | 7/2001 | Kamrukov et al. | |
| 6,265,830 B1 | 7/2001 | Bretmersky et al. | |
| 6,284,050 B1 | 9/2001 | Shi et al. | |
| 6,319,809 B1 | 11/2001 | Chang et al. | |
| 6,323,601 B1 | 11/2001 | Klein et al. | |
| 6,331,480 B1 | 12/2001 | Tsai et al. | |
| 6,380,270 B1 | 4/2002 | Yates | |
| 6,406,836 B1 | 6/2002 | Mohondro et al. | |
| 6,457,846 B2 | 10/2002 | Cook et al. | |
| 6,458,430 B1 | 10/2002 | Bernstein et al. | |
| 6,475,930 B1 | 11/2002 | Junker et al. | |
| 6,503,693 B1 | 1/2003 | Mohondro et al. | |
| 6,524,936 B2 | 2/2003 | Hallock et al. | |
| 6,559,460 B1 | 5/2003 | Keogh et al. | |
| 6,566,278 B1 | 5/2003 | Harvey et al. | |
| 6,582,891 B1 | 6/2003 | Hallock et al. | |
| 6,585,908 B2 | 7/2003 | Cardoso et al. | |
| 6,589,715 B2 | 7/2003 | Joubert et al. | |
| 6,591,850 B2 | 7/2003 | Rocha-Alvarez et al. | |
| 6,593,699 B2 | 7/2003 | Lagos | |
| 6,597,003 B2 | 7/2003 | Janos et al. | |
| 6,605,484 B2 | 8/2003 | Janos et al. | |
| 6,610,169 B2 | 8/2003 | Nguyen et al. | |
| 6,614,181 B1 | 9/2003 | Harvey et al. | |
| 6,619,819 B2 | 9/2003 | Stowell et al. | |
| 6,623,133 B1 | 9/2003 | Keogh | |
| 6,631,726 B1 * | 10/2003 | Kinoshita et al. | 134/102.1 |
| 6,635,117 B1 | 10/2003 | Kinnard et al. | |
| 6,657,206 B2 | 12/2003 | Keogh et al. | |
| 6,663,792 B2 | 12/2003 | Fayfield et al. | |
| 6,664,737 B1 | 12/2003 | Berry et al. | |
| 6,696,801 B2 | 2/2004 | Schmitkons et al. | |
| 6,709,807 B2 | 3/2004 | Hallock et al. | |
| 6,732,451 B2 | 5/2004 | Conwell et al. | |
| 6,734,120 B1 | 5/2004 | Berry et al. | |
| 6,753,506 B2 | 6/2004 | Liu et al. | |
| 6,756,085 B2 | 6/2004 | Waldfried et al. | |
| 6,761,796 B2 | 7/2004 | Srivastava et al. | |
| 6,818,864 B2 | 11/2004 | Ptak | |
| 6,831,419 B1 | 12/2004 | Schmitkons et al. | |
| 6,894,285 B2 | 5/2005 | Kleinschmidt et al. | |
| 7,030,045 B2 | 4/2006 | Johnson | |
| 7,077,547 B2 | 7/2006 | Schmitkons et al. | |
| 7,079,740 B2 | 7/2006 | Vandroux et al. | |
| 7,081,638 B1 * | 7/2006 | Augur | 250/504 R |
| 7,087,482 B2 * | 8/2006 | Yeo et al. | 438/240 |
| 7,119,904 B2 | 10/2006 | Coffin et al. | |
| 7,126,687 B2 | 10/2006 | Hill et al. | |
| 7,265,061 B1 * | 9/2007 | Cho et al. | 438/764 |
| 7,362,416 B2 | 4/2008 | Ito et al. | |
| 7,411,203 B2 | 8/2008 | Fomenkov et al. | |
| 7,449,704 B2 | 11/2008 | Fomenkov et al. | |
| 7,499,154 B2 | 3/2009 | Stock et al. | |
| 2002/0073922 A1 | 6/2002 | Frankel et al. | |
| 2002/0106500 A1 | 8/2002 | Albano et al. | |
| 2003/0015223 A1 | 1/2003 | Jacksier et al. | |
| 2003/0020027 A1 | 1/2003 | Danvers | |
| 2003/0037802 A1 | 2/2003 | Nakahara et al. | |
| 2003/0054115 A1 | 3/2003 | Albano et al. | |
| 2003/0102491 A1 | 6/2003 | Yang et al. | |
| 2003/0111438 A1 | 6/2003 | Mukai et al. | |
| 2003/0139035 A1 | 7/2003 | Yim et al. | |
| 2003/0205553 A1 | 11/2003 | Nakahara et al. | |
| 2004/0021428 A1 | 2/2004 | Swami et al. | |
| 2004/0055636 A1 | 3/2004 | Rocha-Alvarez et al. | |
| 2004/0058090 A1 * | 3/2004 | Waldfried et al. | 427/558 |
| 2004/0065852 A1 | 4/2004 | Harrell et al. | |
| 2004/0096593 A1 * | 5/2004 | Lukas et al. | 427/558 |
| 2004/0096672 A1 * | 5/2004 | Lukas et al. | 428/446 |
| 2004/0099283 A1 | 5/2004 | Waldfried et al. | |
| 2004/0113089 A1 | 6/2004 | Janos et al. | |
| 2004/0155591 A1 | 8/2004 | Schmitkons et al. | |
| 2004/0175501 A1 * | 9/2004 | Lukas et al. | 427/255.28 |
| 2004/0175957 A1 * | 9/2004 | Lukas et al. | 438/778 |
| 2004/0183481 A1 | 9/2004 | Borsuk et al. | |
| 2005/0040341 A1 | 2/2005 | Schmitkons | |
| 2005/0064298 A1 | 3/2005 | Silverman | |
| 2005/0241579 A1 | 11/2005 | Kidd | |
| 2005/0263719 A1 * | 12/2005 | Ohdaira et al. | 250/492.1 |
| 2006/0141806 A1 | 6/2006 | Waldfried et al. | |
| 2006/0165904 A1 * | 7/2006 | Ohara | 427/372.2 |
| 2006/0249175 A1 | 11/2006 | Nowak et al. | |
| 2006/0251827 A1 | 11/2006 | Nowak et al. | |
| 2007/0278419 A1 | 12/2007 | Zani et al. | |
| 2007/0278428 A1 | 12/2007 | Zani et al. | |
| 2007/0286963 A1 | 12/2007 | Rocha-Alvarez et al. | |
| 2008/0075858 A1 | 3/2008 | Koh | |

FOREIGN PATENT DOCUMENTS

| | | |
|---|---|---|
| EP | 0 675 211 A1 | 10/1995 |
| JP | 04225521 | 8/1992 |
| JP | 09120950 | 5/1997 |
| JP | 11111713 | 4/1999 |

OTHER PUBLICATIONS

Waldfried, Carlo, Han, Qingyuan, Escorcia, Orlando, Margolis, Ari, Albano, Ralph, and Berry, Ivan, "Single Wafer RapidCuring™ of Porous Low-k Materials", Axcelis Technologies, Inc., 2002 IEEE, 0-7803-7216/02, pp. 226-228.

http://www.nordson.com/Businesses/UV/IndustrialUV/, Industrial UV Systems, Nordson's CoolWave™, Apr. 7, 2005.

http://www.nordson.com/Businesses/UV/PrimarcLamps/, Primarc UV Curing Lamps, Apr. 7, 2005.

http://www.nordson.com/Businesses/UV/IndustrialUV/, CoolWave® Systems, Apr. 7, 2005.

PCT International Search Report dated Sep. 25, 2006.

The First Office Action for Chinese Patent Application 200680014799.3 dated Jun. 12, 2009.

Korean Office Action "Notice to File a Response" in Patent Application No. 10-2007-7024761 dated Sep. 16, 2009.

Nordson Corporation, "Coolwave® 306 System," revised Nov. 2008, 2 pages, UVL-08-3127, from Internet at "http://www.nordson.com/NR/rdonlyres/81D7F83B-585F-4CF5-B002-E637EE0C1CD7/0/UVL3127CoolWave306.pdf".

Nordson Corporation, "Coolwave® 410 System," revised Apr. 2009, 2 pages, UVL-09-3786, from internet at "http://www.nordson.com/NR/rdonlyres/85426585-9FBA-4977-8929-7E3A242922/0/UVL3786.pdf".

Nordson Corporation, "Coolwave® 610 System," revised Oct. 2008, 2 pages, UVL-08-3116, from Internet at "http://www.nordson.com/NR/rdonlyres/18620695-C7AF-4171-9BA6-9030CE1A92FE/0/UVL3116CoolWave2610.pdf".

Maitland, "Cure - UV Printing & Coating Facts Worth Knowing," Nordson, dated Mar. 20, 2004, 5 pages, from internet at "http://www.nordson.com/NR/rdonlyres/725A7649-6EDE-4850-BF1AACDB045BABB9/0/Cure.pdf".

Primarc UV Technology, "About UV Curing Technology," from the internet at "http://www.nordson.conn/Businesses/PrimarciTechnology/".

Prosecution History of U.S. Appl. No. 11/124,908 filed May 9, 2005, as obtained from PAIR on Jun. 23, 2009.

* cited by examiner

HIGH EFFICIENCY UV CURING SYSTEM

CROSS-REFERENCE TO RELATED APPLICATIONS

This application is a continuation of co-pending U.S. patent application Ser. No. 11/124,908, filed May 9, 2005.

BACKGROUND OF THE INVENTION

1. Field of the Invention

Embodiments of the invention generally relate to an ultraviolet (UV) cure chamber. More particularly, embodiments of the invention relate to a tandem UV chamber for performing cure processes of dielectric films on substrates and clean processes of surfaces within the tandem chamber.

2. Description of the Related Art

Silicon oxide (SiO), silicon carbide (SiC) and carbon doped silicon oxide (SiOC) find extremely widespread use in the fabrication of semiconductor devices. One approach for forming silicon containing films on a semiconductor substrate is through the process of chemical vapor deposition (CVD) within a chamber. Organosilicon supplying materials are often utilized during CVD of the silicon containing films. As a result of the carbon present in such a silicon supplying material, carbon containing films can be formed on the chamber walls as well as on the substrate.

Water is often a by-product of the CVD reaction of oganosilicon compounds and can be physically absorbed into the films as moisture. Moisture in the air inside the substrate fab provides another source of moisture in un-cured films. The ability of the film to resist water uptake while in queue for subsequent manufacturing processes is important in defining a stable film. The moisture is not part of stable films, and can later cause failure of dielectric material during device operation.

Accordingly, undesirable chemical bonds and compounds such as water are preferably removed from a deposited carbon containing film. More importantly, thermally unstable organic fragments of sacrificial materials (resulting from porogens used during CVD to increase porosity) need to be removed. It has been suggested to utilize ultraviolet radiation to aid in the post treatment of CVD silicon oxide films. For example, U.S. Pat. Nos. 6,566,278 and 6,614,181, both to Applied Materials, Inc. and incorporated herein in their entirety, describe use of UV light for post treatment of CVD carbon-doped silicon oxide films.

Therefore, there exists a need in the art for a UV curing chamber which can be used to effectively cure films deposited on substrates. A further need exists for a UV curing chamber that can increase throughput, consume a minimum of energy and be adapted for in situ cleaning processes of surfaces within the chamber itself.

SUMMARY OF THE INVENTION

Embodiments of the invention generally relate to an ultraviolet (UV) cure chamber for curing a dielectric material disposed on a substrate. In one embodiment, a tandem process chamber provides two separate and adjacent process regions defined by a body covered with a lid having bulb isolating windows aligned respectively above each process region. The bulb isolating windows are implemented with either one window per side of the tandem process chamber to isolate one or many bulbs from the substrate in one large common volume, or with each bulb of an array of bulbs enclosed in its own UV transparent envelope which is then in direct contact with the substrate treating environment. One or more UV bulbs per process region are covered by housings coupled to the lid and emit UV light that is directed through the windows onto substrates located within the process regions.

The UV bulbs can be an array of light emitting diodes or bulbs utilizing any of the state of the art UV illumination sources including but not limited to microwave arcs, radio frequency filament (capacitively coupled plasma) and inductively coupled plasma (ICP) lamps. Additionally, the UV light can be pulsed during a cure process. Various concepts for enhancing uniformity of substrate illumination include use of lamp arrays which can also be used to vary wavelength distribution of incident light, relative motion of the substrate and lamp head including rotation and periodic translation (sweeping), and real-time modification of lamp reflector shape and/or position.

Residues formed during the curing process are organic/organosilicon and are removed using an oxygen radical and ozone based clean. Production of the necessary oxygen radicals can be done remotely with the oxygen radicals transported to the curing chamber, generated in-situ or accomplished by running these two schemes simultaneously. Since the oxygen radicals generated remotely recombine very rapidly back into molecular oxygen ($O_2$), the key to remote oxygen based clean is to generate ozone remotely and to transfer this ozone into the curing chamber where the ozone is then allowed to dissociate into oxygen radicals and oxygen molecules when it comes into contact with heated surfaces inside the curing chamber. Consequently, the ozone is essentially a vehicle for transporting oxygen radicals into the curing chamber. In a secondary benefit of the remote ozone clean, ozone that does not dissociate in the cure chamber can also attack certain organic residues thereby enhancing the oxygen radical clean. Methods of generating the ozone remotely can be accomplished using any existing ozone generation technology including, but not limited to dielectric barrier/corona discharge (e.g., Applied Materials Ozonator) or UV-activated reactors. According to one embodiment, the UV bulbs used for curing the dielectric material and/or additional UV bulb(s) that can be remotely located are used to generate the ozone.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
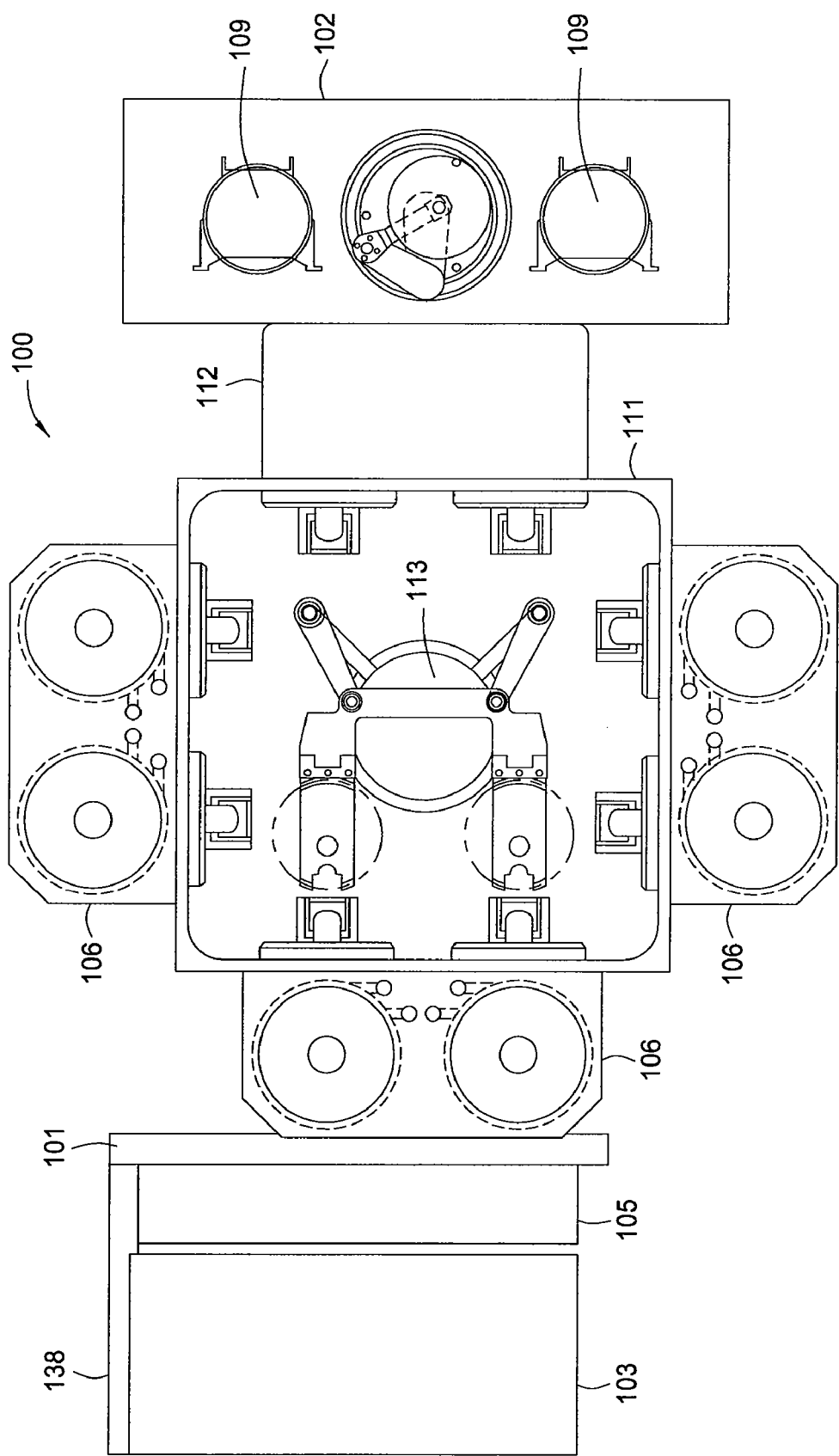
FIG. 1 is a plan view of a semiconductor processing system in which embodiments of the invention may be incorporated.

FIG. 1 shows a plan view of a semiconductor processing system 100 in which embodiments of the invention may be incorporated. The system 100 illustrates one embodiment of a Producer™ processing system, commercially available from Applied Materials, Inc., of Santa Clara, Calif. The processing system 100 is a self-contained system having the necessary processing utilities supported on a mainframe structure 101. The processing system 100 generally includes a front end staging area 102 where substrate cassettes 109 are supported and substrates are loaded into and unloaded from a loadlock chamber 112, a transfer chamber 111 housing a substrate handler 113, a series of tandem process chambers 106 mounted on the transfer chamber 111 and a back end 138 which houses the support utilities needed for operation of the system 100, such as a gas panel 103, and a power distribution panel 105.

Figure 3:
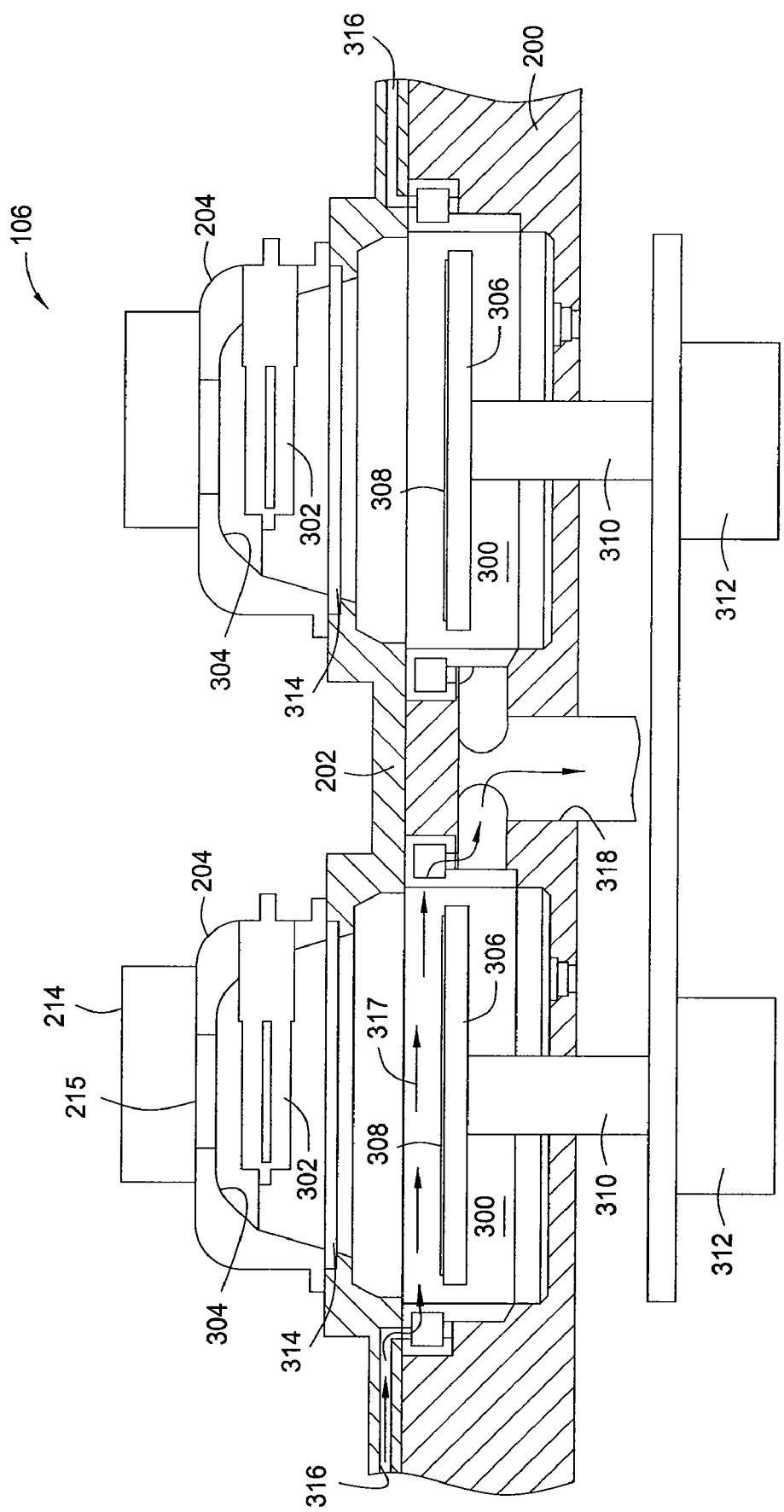
FIG. 3 is a partial section view of the tandem process chamber that has a lid assembly with two UV bulbs disposed respectively above two process regions.

Each of the tandem process chambers 106 includes two processing regions for processing the substrates (see, FIG. 3). The two processing regions share a common supply of gases, common pressure control and common process gas exhaust/pumping system. Modular design of the system enables rapid conversion from any one configuration to any other. The arrangement and combination of chambers may be altered for purposes of performing specific process steps. Any of the tandem process chambers 106 can include a lid according to aspects of the invention as described below that includes one or more ultraviolet (UV) lamps for use in a cure process of a low K material on the substrate and/or in a chamber clean process. In one embodiment, all three of the tandem process chambers 106 have UV lamps and are configured as UV curing chambers to run in parallel for maximum throughput.

In an alternative embodiment where not all of the tandem process chambers 106 are configured as UV curing chambers, the system 100 can be adapted with one or more of the tandem process chambers having supporting chamber hardware as is known to accommodate various other known processes such as chemical vapor deposition (CVD), physical vapor deposition (PVD), etch, and the like. For example, the system 100 can be configured with one of the tandem process chambers 106 as a CVD chamber for depositing materials, such as a low dielectric constant (K) film, on the substrates. Such a configuration can maximize research and development fabrication utilization and, if desired, eliminate exposure of as-deposited films to atmosphere.

Figure 2:
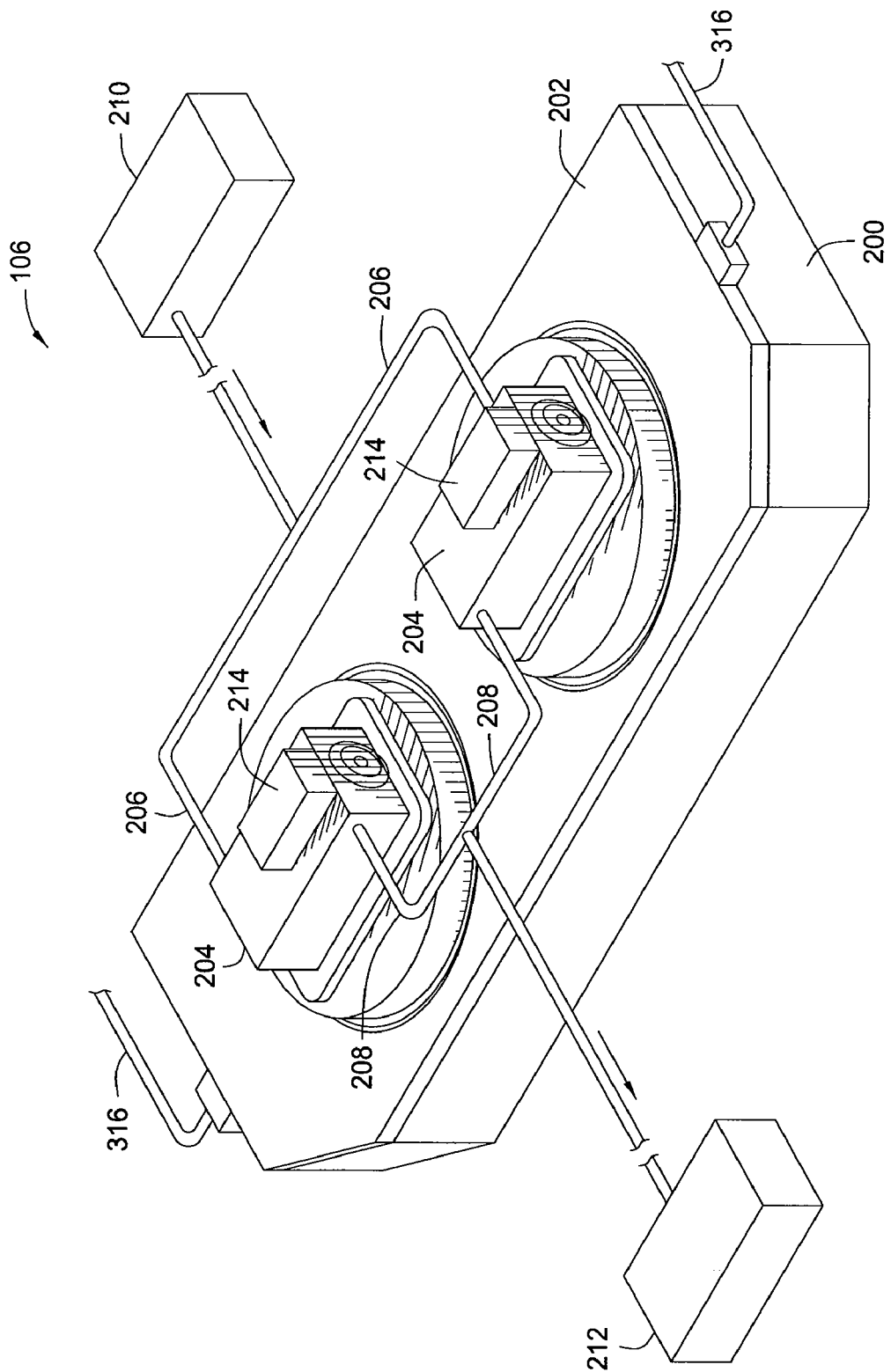
FIG. 2 is a view of a tandem process chamber of the semiconductor processing system that is configured for UV curing.

FIG. 2 illustrates one of the tandem process chambers 106 of the semiconductor processing system 100 that is configured for UV curing. The tandem process chamber 106 includes a body 200 and a lid 202 that can be hinged to the body 200. Coupled to the lid 200 are two housings 204 that are each coupled to inlets 206 along with outlets 208 for passing cooling air through an interior of the housings 204. The cooling air can be at room temperature or approximately twenty-two degrees Celsius. A central pressurized air source 210 provides a sufficient flow rate of air to the inlets 206 to insure proper operation of any UV lamp bulbs and/or power sources 214 for the bulbs associated with the tandem process chamber 106. The outlets 208 receive exhaust air from the housings 204, which is collected by a common exhaust system 212 that can include a scrubber to remove ozone potentially generated by the UV bulbs depending on bulb selection. Ozone management issues can be avoided by cooling the lamps with oxygen-free cooling gas (e.g., nitrogen, argon or helium).

FIG. 3 shows a partial section view of the tandem process chamber 106 with the lid 202, the housings 204 and the power sources 214. Each of the housings 204 cover a respective one of two UV lamp bulbs 302 disposed respectively above two process regions 300 defined within the body 200. Each of the process regions 300 includes a heating pedestal 306 for supporting a substrate 308 within the process regions 300. The pedestals 306 can be made from ceramic or metal such as aluminum. Preferably, the pedestals 306 couple to stems 310 that extend through a bottom of the body 200 and are operated by drive systems 312 to move the pedestals 306 in the processing regions 300 toward and away from the UV lamp bulbs 302. The drive systems 312 can also rotate and/or translate the pedestals 306 during curing to further enhance uniformity of substrate illumination. Adjustable positioning of the pedestals 306 enables control of volatile cure by-product and purge and clean gas flow patterns and residence times in addition to potential fine tuning of incident UV irradiance levels on the substrate 308 depending on the nature of the light delivery system design considerations such as focal length.

In general, embodiments of the invention contemplate any UV source such as mercury microwave arc lamps, pulsed xenon flash lamps or high-efficiency UV light emitting diode arrays. The UV lamp bulbs 302 are sealed plasma bulbs filled with one or more gases such as xenon (Xe) or mercury (Hg) for excitation by the power sources 214. Preferably, the power sources 214 are microwave generators that can include one or more magnetrons (not shown) and one or more transformers (not shown) to energize filaments of the magnetrons. In one embodiment having kilowatt microwave (MW) power sources, each of the housings 204 includes an aperture 215 adjacent the power sources 214 to receive up to about 6000 W of microwave power from the power sources 214 to subsequently generate up to about 100 W of UV light from each of the bulbs 302. In another embodiment, the UV lamp bulbs 302 can include an electrode or filament therein such that the power sources 214 represent circuitry and/or current supplies, such as direct current (DC) or pulsed DC, to the electrode.

The power sources 214 for some embodiments can include radio frequency (RF) energy sources that are capable of excitation of the gases within the UV lamp bulbs 302. The configuration of the RF excitation in the bulb can be capacitive or inductive. An inductively coupled plasma (ICP) bulb can be used to efficiently increase bulb brilliancy by generation of denser plasma than with the capacitively coupled discharge. In addition, the ICP lamp eliminates degradation in UV output due to electrode degradation resulting in a longer-life bulb for enhanced system productivity. Benefits of the power sources 214 being RF energy sources include an increase in efficiency.

Preferably, the bulbs 302 emit light across a broad band of wavelengths from 170 nm to 400 nm. The gases selected for use within the bulbs 302 can determine the wavelengths emitted. Since shorter wavelengths tend to generate ozone when oxygen is present, UV light emitted by the bulbs 302 can be tuned to predominantly generate broadband UV light above 200 nm to avoid ozone generation during cure processes.

UV light emitted from the UV lamp bulbs 302 enters the processing regions 300 by passing through windows 314 disposed in apertures in the lid 202. The windows 314 preferably are made of an OH free synthetic quartz glass and have sufficient thickness to maintain vacuum without cracking.

Further, the windows 314 are preferably fused silica that transmits UV light down to approximately 150 nm. Since the lid 202 seals to the body 200 and the windows 314 are sealed to the lid 202, the processing regions 300 provide volumes capable of maintaining pressures from approximately 1 Torr to approximately 650 Torr. Processing or cleaning gases enter the process regions 300 via a respective one of two inlet passages 316. The processing or cleaning gases then exit the process regions 300 via a common outlet port 318. Additionally, the cooling air supplied to the interior of the housings 204 circulates past the bulbs 302, but is isolated from the process regions 300 by the windows 314.

In one embodiment, each of the housings 204 include an interior parabolic surface defined by a cast quartz lining 304 coated with a dichroic film. The quartz linings 304 reflect UV light emitted from the UV lamp bulbs 302 and are shaped to suit both the cure processes as well as the chamber clean processes based on the pattern of UV light directed by the quartz linings 304 into the process regions 300. For some embodiments, the quartz linings 304 adjust to better suit each process or task by moving and changing the shape of the interior parabolic surface. Additionally, the quartz linings 304 preferably transmit infrared light and reflect ultraviolet light emitted by the bulbs 302 due to the dichroic film. The dichroic film usually constitutes a periodic multilayer film composed of diverse dielectric materials having alternating high and low refractive index. Since the coating is non-metallic, microwave radiation from the power sources 214 that is downwardly incident on the backside of the cast quartz linings 304 does not significantly interact with, or get absorbed by, the modulated layers and is readily transmitted for ionizing the gas in the bulbs 302.

In another embodiment, rotating or otherwise periodically moving the quartz linings 304 during curing and/or cleaning enhances the uniformity of illumination in the substrate plane. In yet another embodiment, the entire housings 204 rotate or translate periodically over the substrates 308 while the quartz linings 304 are stationary with respect to the bulbs 302. In still another embodiment, rotation or periodic translation of the substrates 308 via the pedestals 306 provides the relative motion between the substrates 308 and the bulbs 302 to enhance illumination and curing uniformity.

For cure processes for carbon containing films, the pedestals 306 are heated to between 350° C. and 500° C. at 1-10 Torr, preferably 400° C. The pressure within the processing regions 300 is preferably not lower than approximately 0.5 Torr in order to enhance heat transfer to the substrate from the pedestals 306. Substrate throughput increases by performing the cure processes at low pressure in order to accelerate porogen removal as evidenced by the fact that the rate of shrinkage of the deposited films increases as pressure decreases. Further, the stability of the resulting dielectric constant upon exposure to moisture in the ambient atmosphere of the fab improves when the cure process occurs at a lower pressure. For example, under the same conditions a cure process at 75 Torr created a film with a dielectric constant, κ, of 2.6 while a cure process at 3.5 Torr created a film with a κ of 2.41. After completion of a standard accelerated stability test, the dielectric constant of the film cured at 75 Torr increased to 2.73 while the κ of the film cured at 3.5 Torr increased approximately half as much to 2.47. Thus, the lower pressure cure produced a lower dielectric constant film with approximately half the sensitivity to ambient humidity.

EXAMPLE 1

A cure process for a carbon doped silicon oxide film includes introduction of fourteen standard liters per minute (slm) of helium (He) at eight Torr for the tandem chamber 106 (7 slm per side of the twin) via each inlet passage 316. For some embodiments, the cure processes use nitrogen ($N_2$) or argon (Ar) instead or as mixtures with He since primary concern is absence of oxygen unless other components are desired for reactive UV surface treatments. The purge gas essentially performs two main functions of removing curing byproducts and promoting uniform heat transfer across the substrate. These non-reactive purge gases minimize residue build up on the surfaces within the processing regions 300.

Additionally, hydrogen can be added to beneficially remove some methyl groups from films on the substrates 300 and also scavenge oxygen which is released during curing and tends to remove too many methyl groups. The hydrogen can getter residual oxygen remaining in the chamber after the oxygen/ozone based clean and also oxygen out-gassed from the film during the cure. Either one of these sources of oxygen can potentially damage the curing film by photo-induced reactions of oxygen radicals formed by the short wavelength UV potentially used in the cure and/or by binding with methyl radicals to form volatile byproducts that can leave the final film poor in methyl, yielding poor dielectric constant stability and/or excessively high film stress. Care must be exercised in the amount of hydrogen introduced into the cure process since with a UV radiation wavelength less than approximately 275 nm the hydrogen can form hydrogen radicals that can attack carbon-carbon bonds in the film and also remove methyl groups in the form of $CH_4$.

Some cure processes according to aspects of the invention utilize a pulsed UV unit which can use pulsed xenon flash lamps as the bulbs 302. While the substrates 308 are under vacuum within the processing regions 300 from approximately 10 milliTorr to approximately 700 Torr, the substrates 308 are exposed to pulses of UV light from the bulbs 302. The pulsed UV unit can tune an output frequency of the UV light for various applications.

For clean processes, the temperature of the pedestals 306 can be raised to between about 100° C. and about 600° C., preferably about 400° C. With the UV pressure in the processing regions 300 elevated by the introduction of the cleaning gas into the region through the inlet passages 316, this higher pressure facilitates heat transfer and enhances the cleaning operation. Additionally, ozone generated remotely using methods such as dielectric barrier/corona discharge or UV activation can be introduced into the processing regions 300. The ozone dissociates into $O^-$ and $O_2$ upon contact with the pedestals 306 that are heated. In the clean process, elemental oxygen reacts with hydrocarbons and carbon species that are present on the surfaces of the processing regions 300 to form carbon monoxide and carbon dioxide that can be pumped out or exhausted through the outlet port 318. Heating the pedestals 306 while controlling the pedestal spacing, clean gas flow rate, and pressure enhances the reaction rate between elemental oxygen and the contaminants. The resultant volatile reactants and contaminants are pumped out of the processing regions 300 to complete the clean process.

A cleaning gas such as oxygen can be exposed to UV radiation at selected wavelengths to generate ozone in-situ. The power sources 214 can be turned on to cause UV light emission from the bulbs 302 in the desired wavelengths, preferably about 184.9 nm and about 253.7 nm when the cleaning gas is oxygen, directly onto the surfaces to be cleaned and indirectly by focusing with the quartz linings 304. For example, UV radiation wavelengths of 184.9 nm and 253.7 nm optimizes cleaning using oxygen as the cleaning gas because oxygen absorbs the 184.9 nm wavelength and generates ozone and elemental oxygen, and the 253.7 nm wavelength is absorbed by the ozone, which devolves into both oxygen gas as well as elemental oxygen.

EXAMPLE 2

For one embodiment, a clean process includes introduction of 5 slm of ozone and oxygen (13 wt % ozone in oxygen) into the tandem chamber, split evenly within each processing region 300 to generate sufficient oxygen radicals to clean deposits from surfaces within the processing regions 300. The $O_3$ molecules can also attack various organic residues. The remaining $O_2$ molecules do not remove the hydrocarbon deposits on the surfaces within the processing regions 300. A sufficient cleaning can occur with a twenty minute clean process at 8 Torr after curing six pairs of substrates.

Figure 4:
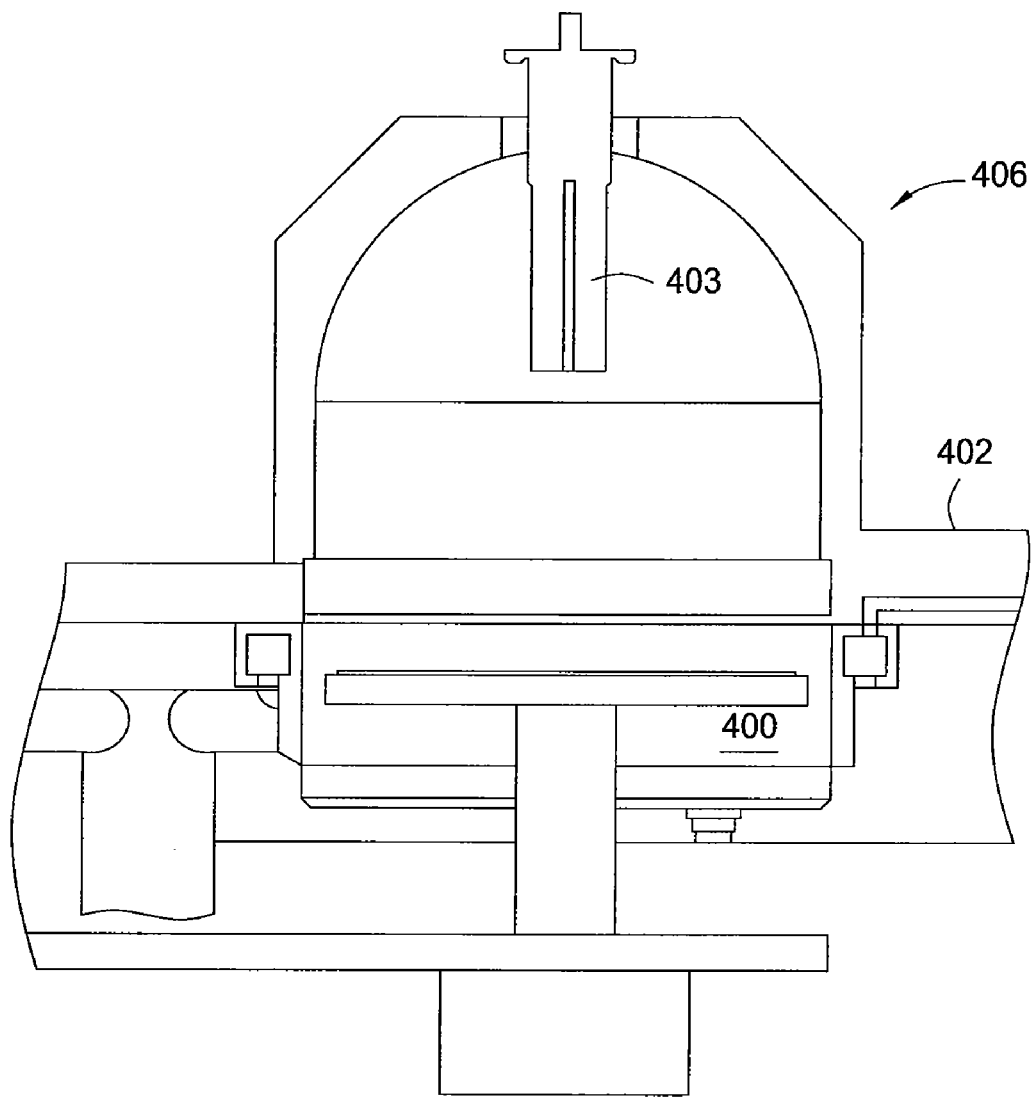
FIG. 4 is a partial section view of a lid assembly with a UV bulb having a long axis oriented vertically above a process region.

FIG. 4 illustrates a partial section view of a lid assembly 402 with a UV bulb having a long axis 403 oriented vertically above a process region 400. The shape of the reflector in this embodiment is different than in any of the other embodiments. In other words, the reflector geometry must be optimized to ensure maximum intensity and uniformity of illumination of the substrate plane for each lamp shape, orientation and combination of single or multiple lamps. Only one half of a tandem process chamber 406 is shown. Other than the orientation of the bulb 403, the tandem process chamber 406 shown in FIG. 4 is similar to the tandem process chamber 106 shown in FIGS. 2 and 3. Accordingly, the tandem process chamber 406 can incorporate any of the aspects discussed above.

Figure 5:
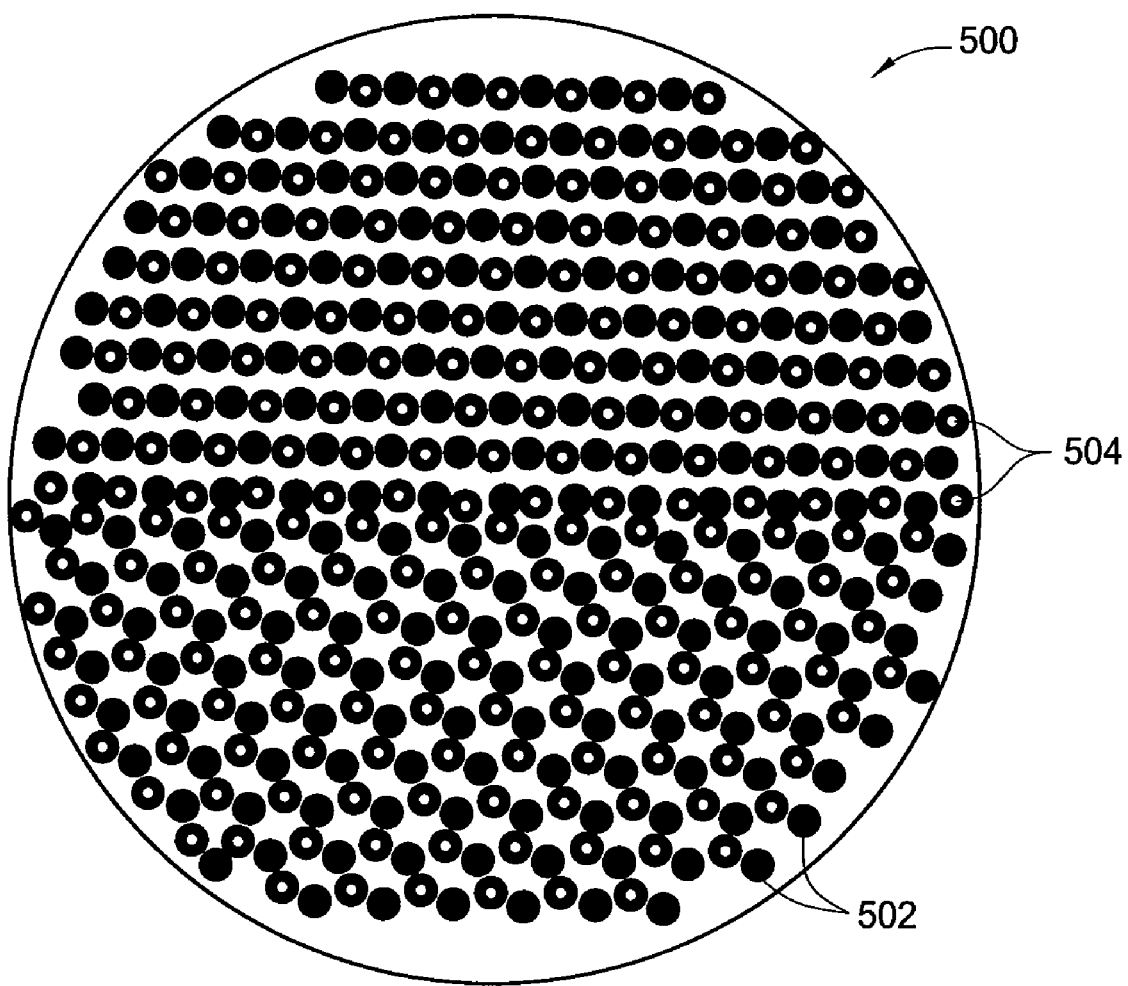
FIG. 5 is a partial view of a bottom surface of a lid assembly that utilizes an array of UV lamps.

FIG. 5 shows a partial view of a bottom surface 500 of a lid assembly that utilizes an array of UV lamps 502. The array of UV lamps 502 can be disposed within a housing above a tandem process chamber instead of single bulbs as depicted in the embodiments shown in FIGS. 2-4. While many individual bulbs are depicted, the array of UV lamps 502 can include as few as two bulbs powered by a single power source or separate power sources. For example, the array of UV lamps 502 in one embodiment includes a first bulb for emitting a first wavelength distribution and a second bulb for emitting a second wavelength distribution. The curing process can thus be controlled by defining various sequences of illumination with the various lamps within a given curing chamber in addition to adjustments in gas flows, composition, pressure and substrate temperature. In addition on a multi-curing chamber system, the curing process can be further refined by defining sequences of treatments in each of the tandem curing chambers each of which is controlled independently with respect to parameters such as lamp spectrum, substrate temperature, ambient gas composition and pressure for the specific portion of the cure for which each is used.

The array of UV lamps 502 can be designed to meet specific UV spectral distribution requirements to perform the cure process and the clean process by selecting and arranging one, two or more different types of individual bulbs within the array of UV lamps 502. For example, bulbs may be selected from low pressure Hg, medium pressure Hg and high pressure Hg. UV light from bulbs with a wavelength distribution particularly suited for cleaning can be directed to the entire process region while UV light from bulbs with a wavelength distribution particularly suited for curing can be directed specifically to the substrate. Additionally, bulbs within the array of UV lamps 502 directed specifically at the substrate may be selectively powered independently from other bulbs within the array of UV lamps 502 such that select bulbs are turned on for either the clean process or the cure process.

The array of UV lamps 502 can utilize highly efficient bulbs such as UV light emitting diodes. UV sources powered by microwave or pulsed sources have a conversion efficiency of five percent compared to low power bulbs, such as 10 W-100 W, that can be in the array of UV lamps 502 to provide a conversion efficiency of about twenty percent. With the microwave power source ninety five percent of the total energy is converted to heat that wastes energy and necessitates extra cooling requirements while only five percent of the energy is converted to UV emission. The low cooling requirement of the low power bulbs can allow the array of UV lamps 502 to be placed closer to the substrate (e.g., between one and six inches) to reduce reflected UV light and loss of energy.

Furthermore, the bottom surface 500 of the lid assembly can include a plurality of gas outlets 504 interleaved within the array of UV lamps 502. Accordingly, curing and cleaning gases can be introduced into a process region within a chamber from above (see, FIGS. 6 and 7).

Figure 6:
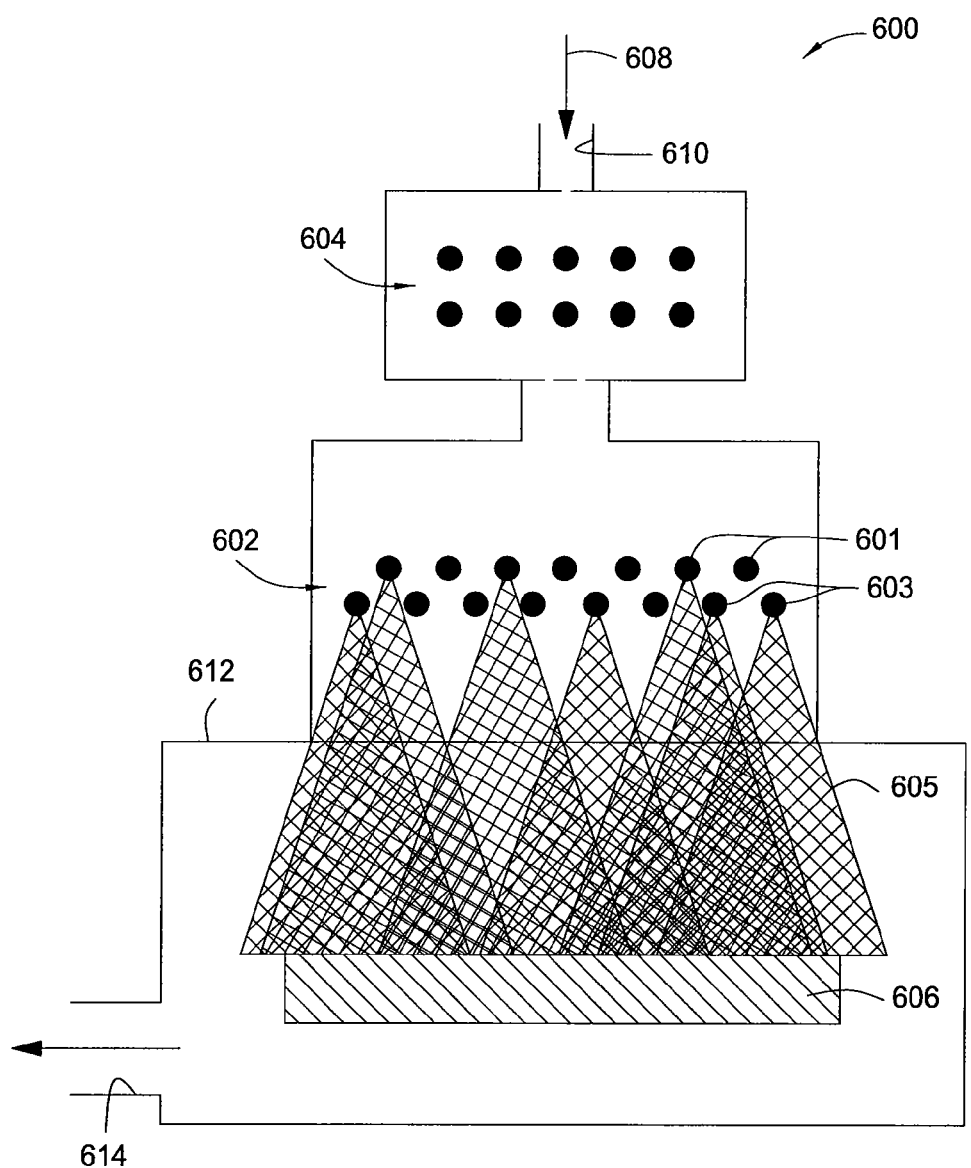
FIG. 6 is a schematic of a process chamber with a first array of UV lamps selected for curing and a second array of UV lamps selected for activating a cleaning gas.

FIG. 6 schematically illustrates a process chamber 600 with a first array of UV lamps 602 selected for curing and a second array of UV lamps 604 remotely located and selected for activating a cleaning gas. The first array of UV lamps 602 is divided into a first group of bulbs 601 having a first wavelength distribution and a second group of bulbs 603 having a second wavelength distribution. Both groups of bulbs 601, 603 within the first array of UV lamps 602 focus UV light (depicted by pattern 605) onto a substrate 606 during a cure process. Thereafter, the cleaning gas (depicted by arrows 608) is introduced through inlet 610 and subjected to UV radiation from the second array of UV lamps 604 to preferably generate ozone. Subsequently, ozone enters a process region 612 where oxygen free radicals caused by activation of the ozone clean the processing region 612 prior to being exhausted via outlet 614.

Figure 7:
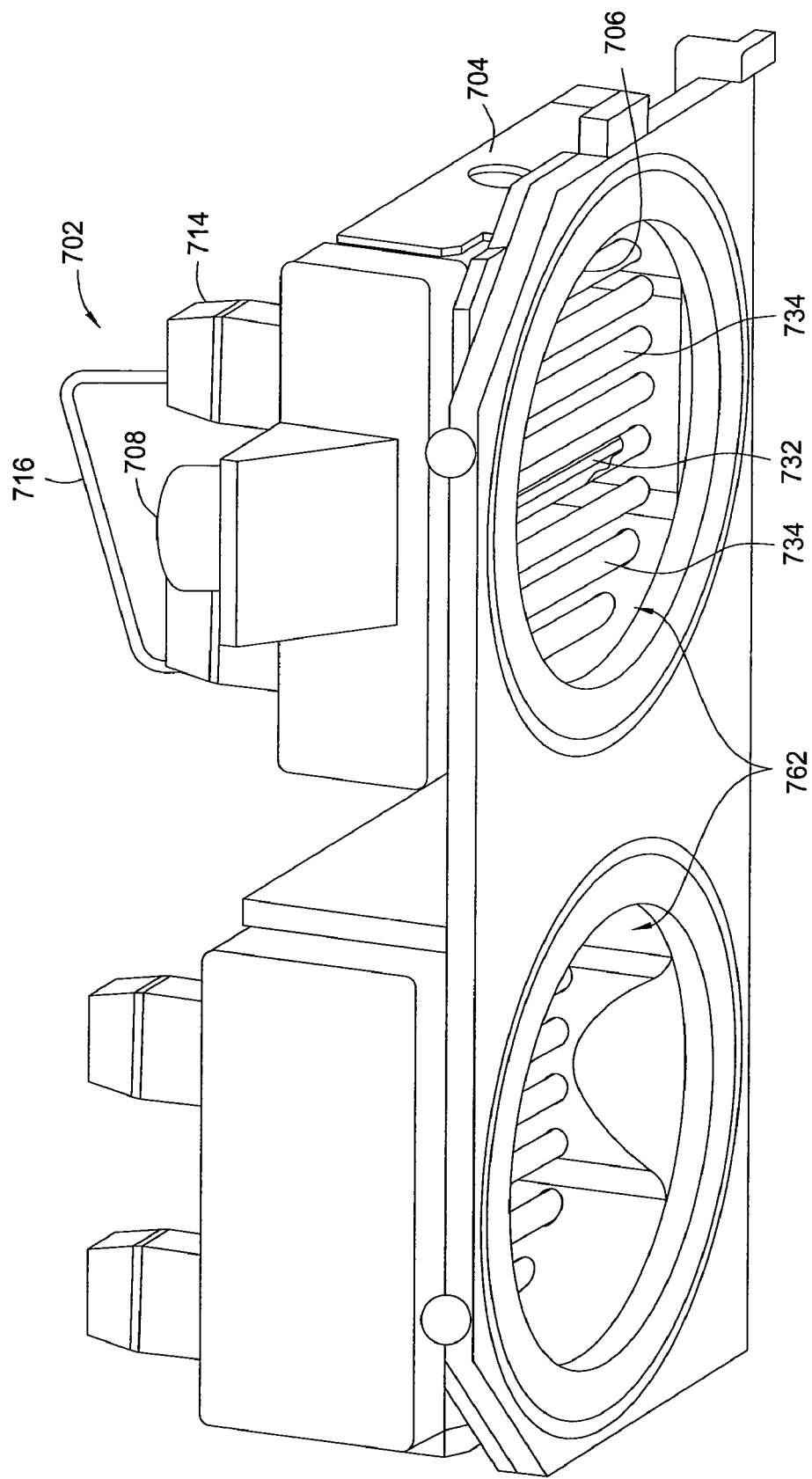
FIG. 7 is an isometric view of a lid assembly for disposal on a tandem process chamber with exemplary arrays of UV lamps arranged to provide UV light to two process regions of the chamber.

FIG. 7 shows an isomeric view of a lid assembly 702 for disposal on a tandem process chamber (not shown) with exemplary arrays of individually isolated UV lamps 762 arranged to provide UV light to two process regions of the chamber. Similar to the embodiment shown in FIGS. 2 and 3, the lid assembly 702 includes a housing 704 coupled to an inlet (not visible) along with a corresponding outlet 208 oppositely located on the housing 704 for passing cooling air across UV lamp bulbs 732 covered by the housing 704. In this embodiment with the arrays of individually isolated UV lamps 762, the cooling air is directed into and passes through an annulus defined between each bulb 732 and a window or UV transmitting protective tube surrounding each bulb 732 individually. An interior roof 706 of the housing 704 can provide a reflector for directing the UV light to a substrate and a blocker to facilitate diffusion of gases supplied into a top of the housing by gas inlet 716.

Any of the embodiments described herein can be combined or modified to incorporate aspects of the other embodiments. While the foregoing is directed to embodiments of the present invention, other and further embodiments of the invention may be devised without departing from the basic scope thereof, and the scope thereof is determined by the claims that follow.

The invention claimed is:

1. An ultraviolet (UV) curing chamber for curing a dielectric material disposed on a substrate, comprising:

a body defining a process region where the substrate is supported;

a lid coupled to a top of the body that covers and seals a top of the process region;

a housing coupled to the lid and disposed above the process region;

a first UV bulb within the housing, wherein a first spectral distribution of the first UV bulb is selected for curing the dielectric material; and a second UV bulb having a second spectral distribution different from the first spectral distribution and selected to generate ozone, wherein the first UV bulb is adapted to provide light that is focused on the substrate while the dielectric material is being cured and the second UV bulb provides, relative to the first UV bulb, light that is directed to the entire process region.

2. The UV curing chamber of claim 1, wherein the second UV bulb is located remotely from the housing and the first UV bulb within a flow path for the ozone into the process region.

3. The UV curing chamber of claim 1, wherein the first UV bulb and the second UV bulb are independently powered.

4. The UV curing chamber of claim 1, wherein the first UV bulb and the second UV bulb each provide less than 100 W of UV light.

5. A process of curing a dielectric material disposed on a substrate, comprising:

disposing the substrate within a process region of an ultraviolet (UV) curing chamber;

curing the dielectric material on the substrate with a first cure treatment by exposing the substrate to a first UV spectrum;

subsequently curing the dielectric material on the substrate with a second cure treatment by exposing the substrate to a second UV spectrum different than the first UV spectrum; and remotely generating ozone using UV light outside of the process region for subsequent introduction of the ozone into the process region during a cleaning process of the process region.

6. The process of claim 5, wherein exposing the substrate to the first UV spectrum includes turning on a first UV bulb above the process region and exposing the substrate to the second UV spectrum includes turning on a second UV bulb above the process region.

7. The process of claim 5, wherein the dielectric material is a carbon-containing film.

8. The process of claim 5, wherein curing the dielectric material comprises exposing the substrate to pulses of UV light.

9. The process of claim 5, further comprising moving a reflector for light emitted to produce the first and second UV spectrums, wherein the moving occurs during the first and second cure treatments to enhance uniformity of illumination.

10. The process of claim 5, further comprising moving a light source used to produce the first and second UV spectrums, wherein the moving occurs during the first and second cure treatments to enhance uniformity of illumination.

11. The process of claim 5, further comprising moving the substrate during the first and second cure treatments to enhance uniformity of illumination.

12. An ultraviolet (UV) curing chamber for curing a dielectric material disposed on a substrate, comprising:

a body defining a process region where the substrate is supported:

a lid coupled to a top of the body that covers and seals a top of the process region;

a housing coupled to the lid and disposed above the process region;

a first UV bulb within the housing, wherein a first spectral distribution of the first UV bulb is selected for curing the dielectric material; and a second UV bulb having a second spectral distribution different from the first spectral distribution and selected to generate ozone, wherein the first UV bulb is adapted to provide light into the process region and the second UV bulb is located remotely from the housing to provide light that generates ozone outside of the process region for subsequent introduction of the ozone into the process region.

* * * * *